United States Patent [19]

Salamy et al.

[11] Patent Number: 5,151,219
[45] Date of Patent: Sep. 29, 1992

[54] USE OF PARTICULAR MIXTURES OF ETHYL LACTATE AND METHYL ETHYL KETONE TO REMOVE UNDESIRABLE PERIPHERAL MATERIAL (E.G. EDGE BEADS) FROM PHOTORESIST-COATED SUBSTRATES

[75] Inventors: Thomas E. Salamy, North Kingstown, R.I.; Marvin L. Love, Jr., Mesa; Mark E. Towner, Gilbert, both of Ariz.

[73] Assignee: OCG Microelectronic Materials, Inc., Cheshire, Conn.

[21] Appl. No.: 386,659

[22] Filed: Jul. 31, 1989

Related U.S. Application Data

[62] Division of Ser. No. 141,128, Jan. 6, 1988, Pat. No. 4,886,728.

[51] Int. Cl.$^5$ .................................................. B01F 1/00
[52] U.S. Cl. .................................... 252/364; 524/317; 524/364; 430/331
[58] Field of Search ................ 524/317, 364; 252/364; 430/331

[56] References Cited

U.S. PATENT DOCUMENTS 4,746,558 5/1988 Shimozawa et al. ............ 428/323

Primary Examiner—Charles L. Bowers, Jr.
Assistant Examiner—Thorl Chea

[57] ABSTRACT

A process for removing unwanted photoresist material from the peripheral areas of a photoresist substrate comprising the steps of:

(a) spin coating a photoresist solution onto a surface of a substrate, thereby applying a photoresist coating which comprises a uniform film over substantially all of said substrate surface except for unwanted photoresist material deposits at the peripheral areas of said surface;

(b) contacting said peripheral area of the coated substrate with a sufficient amount of a solvent mixture comprising a mixture of ethyl lactate and methyl ethyl ketone present in a volume ratio of about 65:35 to about 25:75, respectively, to selectively dissolve said unwanted deposits without adversely affecting said uniform film; and (c) separating said dissolved deposits from said coated substrate.

3 Claims, No Drawings

USE OF PARTICULAR MIXTURES OF ETHYL LACTATE AND METHYL ETHYL KETONE TO REMOVE UNDESIRABLE PERIPHERAL MATERIAL (E.G. EDGE BEADS) FROM PHOTORESIST-COATED SUBSTRATES

This is a division of application Ser. No. 07/141,128, filed Jan. 6, 1988, U.S. Pat. No. 4,886,728.

BACKGROUND OF THE INVENTION

1. Field of the Invention

The present invention relates to a process for selectively removing undesirable peripheral photoresist material (e.g. edge beads) from a photoresist coated-substrate with specific solvent mixtures of ethyl lactate (EL) and methyl ethyl ketone (MEK) which dissolve this peripheral material. In particular, the present invention relates to a process for selectively removing undesirable peripheral material of a photoresist coating comprising a novolak resin and a naphthoquinone diazide photosensitizer from the edge region of an underlying silicon-containing wafer by contacting this peripheral coating material with specific mixtures of ethyl lactate and methyl ethyl ketone which dissolves the peripheral material and allows for its later removal. Furthermore, the present invention relates to, as novel articles of manufacture, the particular mixtures of ethyl lactate and methyl ethyl ketone which are useful for this function.

2. Description of the Prior Art

In the production of micro integrated circuit components or "chips" it is customary to coat a wafer or substrate with a photosensitive material (generally called a photoresist) and then imagewise expose the coated substrate to a light source through a pattern or mask. The portions of the photoresist coating exposed to the light source become chemically altered to permit selective removal of either the exposed portion of the coating or the unexposed portion by a developing solution.

The resultant selectively exposed and developed substrate is then subjected to further processing steps, such as etching, diffusion, plating or the like, to provide the layers of microcircuitry which will eventually result in the production of a number of integrated circuits or chips on the substrate.

Because of the minute spacing between circuit components and conductor paths, introduction of foreign particles, such as dust or the like, is scrupulously avoided. A single particle of dust on the substrate, for example, may result in the malfunction and, therefore, loss of one of the chips made from the substrate. A number of such foreign particles on a substrate may therefore result in a serious decrease in the yield from the wafer or substrate.

It has been found that one source of these unwanted particles is the unused photosensitive coating present at the periphery of the coated substrate.

In most commercial operations, the photoresist coating material is customarily applied as a liquid to the center of a static or spinning substrate (e.g. silicon wafer or the like) and the substrate is then spun at a preselected speed to cause the coating solution to flow or evenly spread across the surface by centrifugal force. Excess material is ejected from the substrate periphery into a catch cup. The objective is to obtain a coating having a uniform thickness over substantially all of the substrate or wafer surface. However, a slight amount of the coating flows over the outer edge of the substrate and onto the periphery of the backside surface. Thus, such spin coating processes often result in extra accumulations of the coating material on the edges of both the coated surface and the backside surface, as well as forming small beads of coating material on the periphery of the substrate between the coated surface and the backside surface of the substrate. This unwanted peripheral material is not used in lithographic processes for making micro integrated circuit components. It has been surmised that the handling of the substrates during later processing may result in the dislodgment or flaking off of the coating on the periphery of the coated substrate with at least some of the dislodged particles becoming inadvertently scattered over the remainder of the coated substrate resulting in eventual defects.

U.S. Pat. Nos. 4,113,492 (Sato et al); 4,510,176 (Cuthbert et al); 4,518,678 (Allen); and 4,685,975 (Kottman et al) all teach particular processes and apparatus for selectively removing this unwanted peripheral coating material by selectively contacting that material with a solvent capable of dissolving it. All of these four patents are incorporated herein by reference in their entireties. This operation is generally known in the art as "edge bead removal" and various solvents have been used commercially for this operation. See column 6, lines 19-46 of U.S. Pat. No. 4,113,492 which lists several suitable solvents. Before this invention, the preferred solvent for commercial applications was ethylene glycol monoethyl ether acetate (EGMEA). However, this particular solvent raises some toxicological concerns. Aliphatic ketones, such as acetone and methyl ethyl ketone, have also been employed singly for this purpose, but are considered hazardous due to their volatility and odoriferous nature. Accordingly, there is a need in the art for better edge bead removal solvents. The present invention is a solution to that need.

BRIEF SUMMARY OF THE INVENTION

Accordingly, the present invention is directed to a process for removing unwanted photoresist material from the periphery of a photoresist-coated substrate comprising the steps of:

(a) spin coating a photoresist solution onto a surface of a substrate, thereby applying a photoresist coating which comprises a uniform film over substantially all of the surface except for unwanted photoresist material deposits (e.g. "edge beads") at the peripheral areas of the surface;

(b) contacting said peripheral areas of the coated substrate surface with a sufficient amount of a solvent mixture comprising a mixture of ethyl lactate and methyl ethyl ketone present in a volume ratio of about 65:35 to about 25:75, respectively, to selectively dissolve said unwanted deposits without adversely affecting said uniform film; and (c) separating said dissolved deposits from the coated substrate.

The thus-treated coated substrate can now be subjected to conventional steps in standard lithographic processes such as softbaking, imaging and developing.

Furthermore, the present invention is directed to the above-noted solvent mixtures per se which are useful in this edge bead removal process.

DETAILED DESCRIPTION

Suitable substrates for this invention include silicon, aluminum or polymeric resins, silicon dioxide, doped silicon dioxide, silicon resins, gallium arsenide, silicon nitride, tantalum, copper, polysilicon, ceramics and aluminum/copper mixtures. The preferred substrates are thermal grown silicon oxide/silicon wafers such as those utilized in the production of microprocessors and other miniaturized integrated circuit components. Aluminum/aluminum oxide wafers can be used as well. The substrate may also comprise the layered material made up of various polymeric resins, especially transparent polymers such as polyesters and polyolefins.

Before the coating with photoresist material, the substrate may be treated or cleaned, or both, according to any conventional technique known in this art.

The photoresist material which is applied as a coating onto the substrate may be any photoresist solution which is applied by means of conventional spin coating techniques and which is dissolvable in the ethyl lactate/methyl ethyl ketone mixtures mentioned above. The preferred photoresist solutions are those positive working photoresists which comprise a novolak resin, preferably mixed isomer cresol/formaldehyde novolaks and phenol/formaldehyde novolak and a naphthoquinone diazide photosensitizer dissolved in a suitable solvent (e.g. ethyl lactate). One example of this type of preferred photoresist is WAYCOAT ® HPR 504 available from Olin Hunt Specialty Products, Inc. of West Paterson, N.J. which is made of a mixed isomer cresol/formaldehyde novolak and a naphthoquinone diazide photosensitizer in an ethyl lactate solvent.

Any conventional coating process may be employed to apply the photoresist solution to the substrate. The coating process parameters (e.g. speed of spinning, thickness of photoresist film and the like) may be varied according to desired end use. In the coating operation involving a semiconductor wafer made up of silicon oxide/silicon, the wafer is placed on vacuum chuck and spun at high speed after or while a photoresist solution is centrally dispersed onto the top surface of the wafer.

After the photoresist film has been applied to the substrate, the critical features of the present inventive process come into play. In these steps, the peripheral portion of the photoresist coating adjacent to the top or coated edge and the backside or bottom edge of the substrate, as well as any coated photoresist material lying over the edge of the substrate, is contacted with the subject solvent mixture so as to dissolve this unwanted material and then it is removed. This unwanted material before removal is shown graphically in FIG. 1 of U.S. Pat. No. 4,113,492 (Sato et al). More specifically, conventional spin coating steps also sometimes form undesirable edge beads on the peripheral area between the coated or top surface of the substrate and the backside or bottom surface of the substrate. These edge beads are shown graphically in FIGS. 5 and 6 of U.S. Pat. No. 4,685,975 (Kottman et al). After this solvent contact and material removal, the desired partially coated substrate is best shown graphically by FIG. 3 of U.S. Pat. No. 4,518,678 (Allen).

As stated above, mixtures of ethyl lactate to methyl ethyl ketone in volume ratios from about 65:35 to 25:75, respectively are used. Preferable volume ratios are from about 60:40 to about 40:60. The most preferred volume ratio of the two solvents is 50:50.

The preferred method of contacting this peripheral coating material with the solvent mixture is by applying the solvent mixture from a pressurized container by means of a nozzle directed to the backside edge of the substrate as shown in FIGS. 3, 4, and 5 of U.S. Pat. No. 4,113,492 (Sato et al). The solvent mixture is dispersed for a period of about 2 to about 20 seconds, preferably about 5 to 15 seconds, while the wafer is spun at a predetermined speed depending upon the thickness of the coating film and the diameter of the water. The desired amount of edge bead removal solvent mixture will depend upon the particular application (e.g. type and size of substrate, type of photoresist and thickness of photoresist coating). Generally, amounts from about 10 ml to about 20 ml are used for 4 inch silicon wafers having a conventional positive working photoresist.

The speed used, during this dispersing of the coating removal solvent mixture, is preselected to permit migration of the solvent mixture around the edge of the substrate and onto the periphery of the top surface of the wafer. The slower the speed, the further inward migration of the chemical on the top surface resulting in a larger band of coating which will be removed. Of course, the removal of a larger band of peripheral coating material means that there will be a smaller useful area remaining on the substrate for further processing (e.g. lithographic imaging and developing). Accordingly, the desired size of the peripheral band removed should be large enough to remove any uneven areas of coated material on the periphery (thus leaving a substantially uniform film thickness throughout the coated surface) yet be minimized so as to maximize the useful surface area on the substrate. For most applications, it is desirable to remove a peripheral band from about 0.75 mm to about 2.0 mm, with the smallest possible bands being more preferred.

The optimum dispersing speed used for this particular solvent mixture is believed to be in the range for a 4 inch oxidized silicon/silicon wafer from about 350 RPM to about 700 RPM, more preferably from about 450 RPM to about 650 RPM.

Following the dispersing period, the wafer is spun at a higher speed e.g. above 2000 RPMs, more preferably about 2500 to about 3500 RPMs, to remove the dissolved coating in the desired peripheral areas by means of centrifugal force. A spin time of 2 to 20 seconds or longer may be used for this step.

After this edge bead removal operation, the coated substrate may be subjected to conventional lithographic processing (e.g. softbaking to better adhere the photoresist coating to the substrate and remove residual casting solvent; imagewise exposing the coated substrate to light radiation; and developing the imagewise exposed coated substrate to form a pattern in said coating). The specific process parameters for each of these subsequent steps will depend upon many factors and it is within the skill of an ordinary skilled artisan in the field to choose the best parameters.

EXPERIMENTS 1-8

Numerous four inch diameter oxidized silicon wafers each having a 6000 angstrom undoped thermally-grown silicon dioxide layer on their face were employed as substrates for these examples. Each of the round wafers had a small portion of the rounded edge removed to form a flat edge. This flat edge (referred to in the art as "the flat") comprised an approximately 20°-30° arc of the circumference of the wafer. These wafers were first cleaned in two baths each containing hydrogen peroxide/sulfuric acid mixture (5 minutes immersing in each bath) followed by rinsing in a double cascade deionized water rinse unit and spin drying in a Semitool Model ST-2700 Rinser/Dryer equipped for 4-inch wafers.

Next, any remaining water vapor was removed from these cleaned wafers and they were then primed with hexamethyldisilizane (HMDS) in a Yield Engineering System Model LPIII-M58 Vacuum Bake/Vapor Prime Oven at a temperature of 150° C. In this dehydration and priming operation, the wafers were subjected to an alternating vacuum step (2.5 minutes) and hot nitrogen gas feed (2.5 minutes) for three times in this oven, followed by adding the HMDS vapors for 1 minute at 5 to 8 torr of pressure and then removing the remaining HMDS vapors from the oven by a purge cycle consisting of 2 minutes vacuum, 2 minutes nitrogen, and 2 minutes vacuum. The dehydrated and primed wafers were then removed from the oven after the oven was vented with nitrogen for 3 minutes. The wafers were then cooled to room temperature.

The topside of each wafer was then coated with WAYCOAT® HPR 504 Resist (a mixed isomer cresol/formaldehyde novolak resin and naphthoquinone diazide sensitizer-containing positive photoresist dissolved in ethyl lactate available from Olin Hunt Specialty Products, Inc. of West Paterson, N.J.). A Silicon Valley Group Inc. (SVG) Model 8626 coater was used to apply the resist. The topside of each wafer was uniformly coated with 12,000 angstroms of the resist except for an undesirable beads formed around the edge or periphery of the wafer.

In this coating operation, approximately 3 milliliters of resist were pumped onto the center of a static wafer. The spin-coater was then started to spread the resist for 3 seconds at 500 RPM. Then, the wafers were accelerated at 8000 RPM/sec. to the desired spin speed of 5000 RPM. The spin time at this speed was 20 seconds.

The coated wafers were then subjected to a edge bead removal operation using the same coating apparatus with a edge bead removal solution applied by means of a back-side rinse nozzle (SVG part No. 06956-01; 0.064 inch orifice). Each wafer was treated with one of eight different edge bead remover solutions. The edge bead removal solvent in each case was dispensed from a pressurized cannister equipped with a precision regulator. These edge bead removal solvents were each applied to the backside edge of the photoresist-coated silicon wafer in generally the same manner shown in FIG. 5 of U.S. Pat. No. 4,113,492 (Sato et al). See Table I below for the identity of each solvent solution as well as the optimum Dispense Spin Speed (RPM) of applying each solution.

The object of each test was to determine the optimum or fastest dispense spin speed at which solvent solution would be dispersed so as to form a complete margin between the resist coating edge and wafer edge all around the wafer (i.e. with no scumming or streamers in the cleaned margin). If this disperse speed was increased above the optimum speed, then this margin started to be incomplete. Since it is known that the higher the optimum dispersing speed, the narrower and more uniform this margin became, these edge bead removal solvents which showed higher optimum speed were generally more preferred. However, while it was noted that 100% MEK had the highest optimum dispersing speed, it appeared to undesirably overly attack the photoresist coating.

TABLE I

| Experiment | Solvent Mixture (volume/volume) | Optimum Speed (RPM) | Observations |
|---|---|---|---|
| 1 | 100% EL | 250 | 1.5 mm minimum margin between photoresist coating edge and edge of wafer achievable with clean removal; significant margin non-uniformity in both curved and flat regions of wafer; microscopic analysis of photoresist coating edge showed smooth edge. |
| 2 | 90% EL/10% MEK | 250 | 1.5 mm minimum margin between photoresist coating edge and edge of wafer achievable with clean removal; margin uniformity better than Experiment 1 yet still significant margin non-uniformity in both curved and flat regions; microscopic analysis of photoresist coating edge showed smooth edge. |
| 3 | 80% EL/20% MEK | 300 | 1.25 mm minimum margin achievable with clean removal; significant margin non-uniformity, especially in flat region; resist edge was smooth. |
| 4 | 70% EL/30% MEK | 350 | 1.25 mm minimum margin achievable with clean removal; margin uniformity better than 80% EL/20% MEK but still significant non-uniformity in wafer flat; resist edge was smooth. |
| 5 | 60% EL/40% MEK | 480 | 1.0 mm minimum margin achievable with clean removal, good margin uniformity in both curved and flat regions except for slight non-uniformity in flat; resist edge was smooth. |
| 6 | 50% EL/50% MEK | 550 | 0.75 mm minimum margin achievable with clean removal; good margin uniformity in both curved and flat regions; smooth resist edge. |
| 7 | 25% EL/75% MEK | 690 | 0.75 mm minimum margin achievable with clean removal; good margin uniformity in both curved and flat regions; resist edges showed slightly rough edge in microscopic analysis. |
| 8 | 100% MEK | 1000 | 0.75 mm minimum margin achievable with clean removal; good margin uniformity in both curved and flat regions; resist edges were rough. |

EL = Ethyl Lactate
MEK = Methyl Ethyl Ketone

| Event | Operation | Time (sec.) | Spin Speed (RPM) | Acceleration (RPM/sec.) |
|---|---|---|---|---|
| 1 | Spin | 2.0 | Variable[1] | 10,000 |
| 2 | Dispense | 10.0 | Variable[1] | 10,000 |
| 3 | Spin | 2.0 | Variable[1] | 10,000 |
| 4 | Dry Spin | 10.0 | 3000 | 50,000 |
| 5 | Spin | 2.0 | 0 | 20,000 |

[1] See Table 1 for specific Dispense Spin Speeds
Spin Speeds for Events Nos. 1, 2 and 3 are the same.

During Event No. 2, the edge bead removal solvent mixture was dispersed onto the backside of the coated wafer. The dispersed solvent mixture flows outward on the backside surface of the wafer, then around the convex periphery and inward on the coated face of the wafer. In Event No. 3, there was no solvent dispensed. Since the edge bead removal solvent was still clinging to the wafer edge surfaces, after the dispensing step, this step removes substantially any remaining solvent and helps ensure that the margins between the resulting photoresist coating edge and the wafer edge are uniform. Event No. 4 dries the treated wafer and removes any loose particles of photoresist material still remaining on the edge portion of the wafer.

The other process parameters for this bead removal process for each example are as follows:

| DISPENSE AMOUNT | 12.5 ml |
|---|---|
| DISPENSE PRESSURE | 50 oz./in² (3.13 psi) |
| METERING VALVE SETTING | 2.25 |
| NOZZLE PLACEMENT | fixed 10 mm from wafer edge |

After this edge bead removal operation, the coated wafers were subjected to a softbake operation using a Silicon Valley Group Inc. Model 8636 Hot Plate Oven. The softbake temperature was 110° C. and the softbake time was 50 seconds.

After the softbake, each wafer was examined to determine the extent and quality of the edge bead removal operation. The results of those observations are also stated in Table I.

Looking at the observations in Table I, Experiment 1 (100% by volume EL) showed 1.5 mm minimum margin between the resist coating edge and the wafer edge at the optimum disperse speed. This is a relatively large margin and would result in a less usable wafer area than a coated wafer which has a more desirable narrower margin (e.g. 0.75 mm). Moreover, there was considerable non-uniformity in these margins. Thus, the coated wafers made with this edge bead removal solvent solution would be rejected for most commercial uses.

Likewise, Experiments 2-4 resulted in margin observations in which relatively wide and non-uniform margins were made. The coated wafers made with these edge bead removal solvents would also be unsuitable for many commercial applications.

Experiments 5, 6 and 7 resulted in relatively narrow and uniform margins which make the resulting wafer more suitable for most commercial results. The wafers using the edge bead removal solution of Experiment 5 is the most preferred.

Experiment 8 (100% MEK) resulted in relatively narrow and uniform edge margins in resists. However, microexamination of the resist edge showed that it was rough (i.e. comparable to the edge of a sheet of paper torn by hand as compared to the smooth edge of a sheet of paper cut with scissors). This rough edge may more likely cause the formation of undesirable particles in later operating steps and thus makes the wafers less acceptable for many commercial applications.

EXPERIMENTS 9-12

The process of the above experiments was repeated with four (4) different edge bead removal solutions, namely, 50% by volume ethyl lactate/50% by volume methyl ethyl ketone; (2) 100% by volume ethyl lactate; (3) EGMEA and (4) acetone. The objective in these experiments was to remove 1.5 mm margin of resist from the edge of each wafer with each bead removal solution. This objective was accomplished with the edge bead removal operation process parameters for each experiment shown in Table II.

TABLE II

|  | 50% EL/MEK | Ethyl Lactate | EGMEA | Acetone |
|---|---|---|---|---|
| Dispense Spin Speed (rpm) | 500 | 250 | 200 | 350 |
| Dispense Time (sec.) | 10.0 | 10.0 | 10.0 | 10.0 |
| Dispense Amount (ml) | 12.5 | 12.5 | 12.5 | 12.5 |
| Dispense Pressure (oz./in.²) | 50 | 60 | 45 | 32 |
| Metering Valve Setting | 2.25 | 2.10 | 2.35 | 1.90 |
| Dispense Nozzle Size (inches) | 0.064 | 0.064 | 0.064 | 0.064 |
| Dry Spin Speed (rpm) | 3,000 | 3,000 | 3,000 | 3,000 |
| Dry Ramp Rate (rpm/sec.) | 50,000 | 50,000 | 50,000 | 50,000 |
| Dry Time (sec.) | 10.0 | 10.0 | 10.0 | 10.0 |

Four wafers were processed using each edge bead removal process and then softbaked for 50 seconds at 115° C. on an SVG Model 8636 Hot Plate Oven.

Scanning Electron Microscope (SEM) photographs were taken of a resist edge profile of a wafer treated by each edge bead removal solvent. Resist thickness measurements at the edge of the resist removal margin were taken off the SEM photographs with a dial caliper gauge.

These resist film thickness measurements taken from the SEM photographs are shown below.

| RESIST FILM THICKNESS AFTER EDGE BEAD REMOVAL | | | |
|---|---|---|---|
| Edge Bead Removal Solvent | SBFT ($\mu$) | Resist Edge Thickness ($\mu$) | Thickness Change ($\mu$) |
| 50% EL/50% MEK | 1.13 | 1.22 | 0.09 |
| Ethyl Lactate | 1.35 | 1.75 | 0.40 |
| EGMEA | 1.25 | 1.67 | 0.42 |
| Acetone | 1.27 | 2.45 | 1.18 |

SBFT = softbaked film thickness
EGMEA = ethylene glycol monoethyl ether acetate

An increase in resist film thickness was observed with all edge bead removal solvents; however, the EL/MEK mixture showed considerably less swelling. This less swelling will improve lithographic performance (e.g. improved critical dimension control), especially where contact exposure tools are utilized.

EXPERIMENTS 13 and 14

The effect of 50% by volume EL/50% by volume MEK solvent mixture on the photospeed of the resist was tested. Six silicon wafers similar to those used in the proceeding experiments were spin coated with WAYCOAT® HPR 504 photoresist in the same manner as explained above. Three of the wafers were placed in a closed container into which 100 ml of the solvent mixture had been added. The wafers were exposed to the saturated atmosphere (without actual contact to the solvent mixture) in the container for 60 seconds. The other three wafers were not so treated.

Next, all six wafers were then softbaked for 50 seconds at 115° C. on the SVG Model 8636 Hot Plate Oven. The softbaked wafers were exposed using a GCA Model 4800 Stepper and immersion developed for 60 seconds at 21° C. in WAYCOAT POSITIVE LSI Developer Solution (available from Olin Hunt Specialty Products of West Paterson, N.J.) diluted 1:1 with deionized water. Developed image dimension of a 2.0 micron mask feature were measured using an ITP System 80 dimensional measurement system. The results are shown in Table III.

TABLE III

| Developed Image Dimensions (μ) | | |
|---|---|---|
| Solvent Exposure | Mean | Standard Dev. |
| Yes | 2.03 | 0.02 |
| No | 2.01 | 0.02 |

These results indicate that the above EL/MEK solvent mixture does not have any appreciable effect on the photospeed of the photoresist formulation employed.

What is claimed is:

1. A solvent mixture consisting essentially of a mixture of ethyl lactate and methyl ethyl ketone present in a volume ratio of about 65:35 to about 25:75, respectively.

2. The solvent mixture of claim 1 wherein said volume ratio is from about 60:40 to about 40:60 respectively.

3. The solvent mixture of claim 2 wherein said volume ratio is about 50:50.

* * * * *